Figure 1:
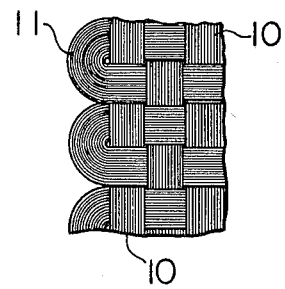

United States Patent [19]

Yokono et al.

[11] 4,428,995
[45] Jan. 31, 1984

[54] GLASS CLOTH AND PREPREG CONTAINING SAME

[75] Inventors: Haruki Yokono, Yuki; Tsugihiko Hiratsuka, Shimodate, both of Japan

[73] Assignee: Hitachi Chemical Company, Ltd., Tokyo, Japan

[21] Appl. No.: 427,582

[22] Filed: Sep. 29, 1982

[30] Foreign Application Priority Data

Sep. 30, 1981 [JP] Japan .......................... 56-146282[U]
Sep. 30, 1981 [JP] Japan .......................... 56-146283[U]
Sep. 30, 1981 [JP] Japan .......................... 56-146284[U]

[51] Int. Cl.³ .............................................. B32B 3/02
[52] U.S. Cl. .................................... 428/193; 156/88; 428/251; 428/296; 428/901; 428/273
[58] Field of Search ................. 156/88; 428/192, 193, 428/251, 296, 901, 273

[56] References Cited

U.S. PATENT DOCUMENTS 2,854,352  9/1958  Gronemeyer ....................... 428/193
2,886,481  5/1959  Swan .................................... 156/88
3,076,252  2/1963  Hofmann ............................ 156/88
4,324,827  4/1982  Obayashi ........................... 428/195
4,384,021  5/1983  Aoyama .............................. 428/212

Primary Examiner—James J. Bell
Attorney, Agent, or Firm—Antonelli, Terry & Wands

[57] ABSTRACT

At both ends of glass cloth comprising warp yarns consisting of a number of glass monofilaments and weft yarns consisting of a number of glass monofilaments, the weft yarns being cut at the ends of the glass cloth, glass monofilament-fixing portions are formed by fusing the ends of the weft yarns, by substituting a synthetic resin yarn for the warp yarn at the end of the glass cloth and melting the synthetic resin yarn or by attaching an adhesive tape to the ends of the glass cloth. The glass cloth having the glass monofilament-fixing portions at both ends thereof is advantageous in that no broken pieces of glass monofilament were formed when preparing prepreg or laminate using the glass cloth, and the laminate has excellent accuracy of thickness.

5 Claims, 7 Drawing Figures

GLASS CLOTH AND PREPREG CONTAINING SAME

This invention relates to glass cloth to be used as a base material for a thermosetting synthetic resin laminate.

The production of a thermosetting synthetic resin laminate using glass cloth as a base material is usually carried out by the following method:

Long glass cloth having a width of about 1 m and a length of about 1500 m is continuously impregnated with a varnish of a thermosetting resin such as a phenol resin, an epoxy resin or the like and then heated and dried in a drying oven to allow the solvent of the varnish to volatilize and simultaneously allow the condensation of the resin to proceed to some extent (B stage), and cut in the direction transverse to the longitudinal direction into sheets having an appropriate length and the same width as the original glass cloth, which are so-called prepreg, and thereafter the necessary number of sheets of prepreg are superposed on one another and, if necessary, copper foils are put on the outer surfaces of the resulting assembly, after which the resulting assembly is pressed with heating to produce a thermosetting resin laminate.

The glass cloth used as a base material for such a thermosetting resin laminate is prepared by interweaving warp yarns each consisting of a number of glass monofilaments with weft yarns each consisting of a number of glass monofilaments. Hitherto, in the production of glass cloth, the weft yarn is turned back at the end of the glass cloth to interweave the warp yarns therewith. That is to say, one continuous yarn has hitherto been used as the weft yarn. However, recently, in order to increase the speed of the production of glass cloth, there has been developed a method by which yarns having limited length as weft are passed through between the warp yarns by means of air jet or the like to interweave the warp with the weft. The glass cloth woven by this method has weft yarns cut at both ends of the glass cloth. That is to say, in the glass cloth woven by this method, the weft is composed of yarns cut to the same length as the width of the glass cloth.

In the glass cloth thus obtained, the cut ends of weft yarns expose at both ends of the width of the glass cloth, and therefore, when the said glass cloth is impregnated with a thermosetting resin varnish, heated and dried to form prepreg, there is a tendency that the resin-coated glass monofilaments at the cut ends of the weft yarns are broken off and the resulting broken pieces of glass monofilament come into between prepreg layers superposed or are attached to the surface of the resulting assembly. If such an assembly is pressed with heating to form a laminate, the resulting laminate comes to have irregular surface. Moreover, when it is intended to prepare a copper-clad laminate from the resulting prepreg assembly by overlaying copper foils on the outer surfaces of the assembly, the broken pieces of the glass monofilament are attached to the outer surfaces of the copper foils, and when the assembly with the copper foils is pressed with heating, the broken monofilament pieces are embedded in the copper foil surfaces to render the resulting copper-clad laminate unusable.

According to this invention, there is provided glass cloth comprising warp yarns each consisting of a number of glass monofilaments and weft yarns each consisting of a number of glass monofilaments, said warp being interwoven with said weft, said weft yarns having cut ends at both ends of the width of the glass cloth, characterized in that fixing portions of glass monofilaments constituting the weft yarns are formed at the cut ends of the weft yarns.

Figure 2:
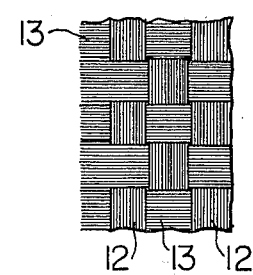

This invention is explained in more detail below referring to the accompanying drawings, in which FIG. 1 is a plan view of a part of the ends of a conventional glass cloth, FIG. 2 is a plan view of a part of the ends of another conventional glass cloth, and FIGS. 3 to 7 are plan views of part of ends of examples of the glass cloth of this invention.

In FIG. 1, 10 refers to warp yarns, and 11 to weft yarns, the weft yarns being turned back at the end of the glass cloth. In FIG. 2, each of weft yarns 13 is passed through between the warp yarns 12 by air jet or the like, whereby the warp yarns are interwoven with each of the weft yarns to prepare glass cloth, in which the cut ends of the weft yarns expose at the end of the glass cloth.

Figure 3:
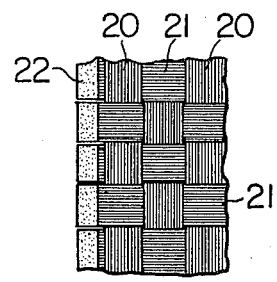

In FIG. 3, 20 refers to warp yarns each consisting of a number of glass monofilaments, 21 to weft yarns each consisting of a number of glass monofilaments, and 22 to fixing portions of the glass monofilaments constituting the weft yarns formed at both cut ends of the weft yarns.

In order to form the fixing portion of the glass monofilaments constituting the weft yarn at the cut ends of the weft yarn, various methods can be applied. In the first instance, a synthetic resin yarn is used as the end warp yarns of the glass cloth in weaving the glass cloth, the ends of the width of the glass cloth are heated to fuse the synthetic resin yarns, thereby forming the fixing portion.

Figure 4:
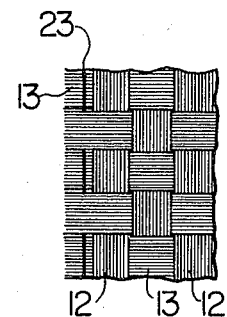
Figure 5:
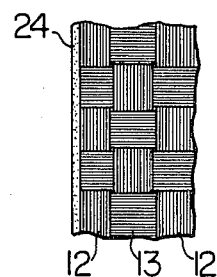

FIG. 4 shows a plan view of glass cloth in which the warp yarns at both ends of the glass cloth are of a synthetic resin. In FIG. 4, 23 refers to a yarn of a synthetic resin. FIG. 5 is a plan view showing the state that the glass monofilament-fixing portion 24 is formed from the synthetic resin layer formed by heating both ends of the glass cloth of FIG. 4 to melt the warp synthetic resin yarn. The glass monofilament-fixing portion 24 formed in FIG. 5 shows the state that after the melting of the synthetic resin yarn, a part of the molten portion has been cut off.

As the synthetic resin yarn, there are preferably used a bundle of synthetic resin tape and a bundle of synthetic resin filaments. In addition, there may also be used a glass fiber yarn coated with a synthetic resin.

In order to form the glass monofilament-fixing portion using a synthetic resin, the following method can also be used: A synthetic resin varnish is applied to the cut ends of the weft yarns of glass monofilaments, or a hot melt resin powder is attached to the cut ends of the weft yarns of glass monofilaments, and then the ends of the weft yarns are heated to melt the resin.

As the synthetic resin, there may be used any heat-sealable resins which are generally used, said resins being thermoplastic.

In order to melt the synthetic resin, there may preferably be used hot air-heating, infrared ray-heating and the like.

In order to form the glass monofilament-fixing portion at the cut ends of the weft yarns, the cut ends of the weft yarns are locally heated to a temperature higher than the melting point of glass by means of fire-flame, laser or the like to achieve the purpose.

Figure 6:
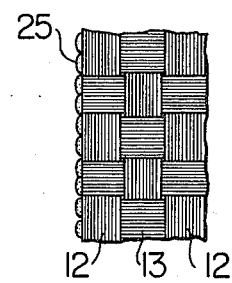

FIG. 6 is a plan view showing the glass cloth obtained by the method mentioned just above, in which 25 refers to the fused portion of the glass monofilament.

Figure 7:
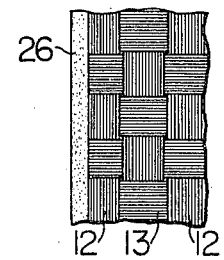

The glass monofilament-fixing portion can also be formed by covering the cut ends of the weft yarns with an adhesive tape. For this purpose, the adhesive tape is preferably a plastic tape with an adhesive. FIG. 7 is a plan view showing the glass cloth obtained by this method, in which 26 refers to an adhesive tape.

The glass cloth thus obtained is impregnated with a varnish of a thermosetting resin such as a phenol resin, an epoxy resin or the like, and then heated and dried to volatilize the solvent of the varnish and simultaneously condense the resin to the B-stage, thereby obtaining prepreg. The necessary number of sheets of the prepreg are superposed on one another and, if necessary, a copper foil is put on each of the outer surfaces of the resulting assembly, after which the resulting assembly is pressed with heating to form a laminate, or a copper-clad laminate.

The glass cloth of this invention can bring about the following advantages:

(1) In the prepreg obtained by using the glass cloth of this invention, the resin-coated monofilaments are not broken at the ends of the glass cloth, and therefore, no broken pieces of glass monofilament are formed. Thus, the surface state of the laminate is quite uniform. In addition, no broken pieces of glass monofilament are embedded in the copper foil surfaces.

(2) When the prepreg obtained using the glass cloth of this invention is pressed with heating, the impregnating resin is allowed to condense, whereby the viscosity of the resin is first lowered and then raised until the resin is cured. When the viscosity of the resin is lowered, the flow of the resin is inhibited by the glass monofilament-fixing portion at the ends of the glass cloth, whereby a laminate having a high accuracy of thickness can be obtained.

(3) When a laminate is produced from the prepreg obtained using the glass cloth of this invention, a stack of a number of sheets of prepreg is formed, and thereafter, the necessary number of sheets of prepreg are taken out of the stack to be sent to a pressing machine. This taking-out working is preferably conducted automatically. When a number of sheets of the prepreg of this invention are superposed on one another, the resulting stack can easily be kept flat without being warped, and therefore, the automation of the taking-out working becomes easy. (4) Unless the glass monofilament-fixing portions are formed at the ends of the glass cloth, it will be necessary to cut the glass cloth ends by several millimeters to several centimeters in order to prevent broken pieces of glass monofilaments from being formed after the impregnation of glass cloth with a thermosetting resin and curing the resin. However, it is not necessary to do so when the glass cloth of this invention is used. Therefore, the production cost can be saved about 2%.

EXAMPLE 1

A saturated polyester varnish (solids content: 30% by weight) (solvent: methylene chloride) was applied to both ends of glass cloth (No. 7628 of Burlington in U.S.A.) in a width of 5 mm so that the amount of the resin applied became 60 g/m$^2$. The glass cloth was heated and dried with hot air at 100° C. for 30 sec, and thereafter the varnish-applied portion (5 mm in width) was cut at the center.

The glass cloth thus obtained was impregnated with an epoxy resin varnish having the following composition:

Epikote 1001 (manufactured by Yuka Shell Epoxy): 100 parts by weight
Dicyandiamide: 2 parts by weight
Benzyldimethylamine: 0.3 part by weight
Methyl ethyl ketone: Such an amount that the resin solids content became 60% by weight.

The impregnated glass cloth was heated and dried to obtain prepreg.

Eight sheets of the prepreg were superposed on one another, and the resulting assembly was pressed at 170° C. at a pressure of 100 kg/cm$^2$ for 90 min to produce a laminate. To the prepreg were attached no broken pieces of glass monofilament, and a laminate with high accuracy of thickness was got.

EXAMPLE 2

The ends of the same glass cloth as in Example 1 were irradiated with laser rays by means of a carbon dioxide laser (SL-151 manufactured by Shimada Rika Kogyo K.K.) (operation conditions: wavelength 9–11μ, output 50 W) to fuse the cut ends of the weft yarns.

Using the glass cloth thus obtained, a laminate was prepared in the same manner as in Example 1. No broken pieces of glass monofilament were observed and the accuracy of thickness of the resulting laminate was excellent.

EXAMPLE 3

An adhesive tape having a width of 10 mm formed by coating an adhesive composed mainly of an acrylic resin on a polyethylene film was applied to each of the ends of the same glass cloth as in Example 1 so that the end of the glass cloth was put between the folded tape with the adhesive inside thereof, and was attached to the glass cloth. Using the glass cloth thus obtained, a laminate was prepared in the same manner as in Example 1. In this case, no broken pieces of glass monofilament were formed, and the accuracy of thickness of the laminate was excellent.

EXAMPLE 4

In the glass cloth of Example 1, the end warp yarns were replaced by two yarns having a thickness of 1 mm obtained by twisting 400 monofilaments of polyester (Tetoron, a trade name of Teijin Kabushiki Kaisha). The polyester yarns at both ends of the glass cloth were heated by applying hot air at 250° C. thereto to soften the yarns, thereby forming synthetic resin layers fixing the monofilaments constituting the weft yarns at both ends of the weft yarns. A laminate was prepared using this glass cloth in the same manner as in Example 1. In this case, no broken pieces of glass monofilaments were generated and the laminate obtained had a high accuracy of thickness.

What is claimed is:

1. A prepreg which comprises a glass cloth impregnated with a thermosetting resin varnish followed by heating and drying to form a B-stage thermosetting resin varnish impregnant therein, said glass cloth comprising warp yarns each consisting of a number of glass monofilaments and weft yarns each consisting of a number of glass monofilaments, said warp yarns being interwoven with said weft yarns and the weft yarns being cut at the ends of the glass cloth; both cut ends of the weft yarns having fixed portions of the glass monofilaments formed by bonding the cut ends of the weft yarns together whereby breakage of the cut ends is prevented.

2. The prepreg according to claim 1, wherein the glass monofilament fixed portions are formed of a synthetic resin layer bonding the glass monofilaments formed at both cut ends of the weft yarns.

3. The prepreg according to claim 1, wherein the glass monofilament fixed portions are formed of molten glass monofilaments formed at the cut ends of the weft yarns.

4. The prepreg according to claim 1, wherein the glass monofilament-fixed portions are formed of an adhesive tape provided at the cut ends of weft yarns.

5. A laminate obtained from the prepreg of claim 1 by forming a stack of a number of sheets of the prepreg and, thereafter, superimposing the number of sheets on one another wherein the resulting stack is, thereafter, pressed together with heating whereby the impregnating resin is allowed to condense and the viscosity of the resin is first lowered and then raised until the resin is cured; the flow of resin when the viscosity of the resin is lowered being inhibited by the fixed portions of the cut ends of the glass cloth whereby a laminate having a uniform thickness is obtained.

* * * * *